United States Patent
Chang

(10) Patent No.: US 8,363,397 B2
(45) Date of Patent: Jan. 29, 2013

(54) CONTAINER DATA CENTER AND VENTILATING SYSTEM THEREOF

(75) Inventor: Yao-Ting Chang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 273 days.

(21) Appl. No.: 12/979,295

(22) Filed: Dec. 27, 2010

(65) Prior Publication Data

US 2012/0140407 A1    Jun. 7, 2012

(30) Foreign Application Priority Data

Dec. 7, 2010    (TW) .............................. 99142687 A

(51) Int. Cl.
*H05K 7/20*    (2006.01)

(52) U.S. Cl. .............. 361/679.49; 361/679.48; 361/689; 361/690; 361/692; 361/694; 165/80.2

(58) Field of Classification Search ........................ None
See application file for complete search history.

(56) References Cited

U.S. PATENT DOCUMENTS

| | | | |
|---|---|---|---|
| 5,796,580 A * | 8/1998 | Komatsu et al. | 361/679.48 |
| 7,499,276 B2 * | 3/2009 | Cole | 361/695 |
| 2012/0167600 A1 * | 7/2012 | Dunnavant | 62/89 |

* cited by examiner

*Primary Examiner* — Boris Chervinsky
(74) *Attorney, Agent, or Firm* — Altis Law Group, Inc.

(57) ABSTRACT

An exemplary container data center includes a container, servers received in the container; and a ventilating system for cooling the servers. The ventilating system includes a filter, an exhaust pipe and a blower. The filter includes a chamber and filtering fluid received in the chamber for dissolving dust in ambient air. The chamber defines an air inlet for entering the ambient air and an air outlet. The exhaust pipe has one end coupled to the air outlet of the filter and another end communicating an interior of the container. The blower drives the ambient air out of the filter to flow along the exhaust pipe to the container to cool the servers.

20 Claims, 3 Drawing Sheets

CONTAINER DATA CENTER AND VENTILATING SYSTEM THEREOF

BACKGROUND

1. Technical Field

The present disclosure relates to container data centers, and more particularly to a container data center having a ventilating system for dissipating heat thereof.

2. Description of Related Art

Generally, a plurality of servers is densely arranged in a standard container to form a container date center. Each of the servers typically includes at least a power supply device, a motherboard, a hard disk drive, and an optical disk drive, all of which can generate considerable heat during operation of the server. Generally, cooling fans are provided to draw cooling air from the ambient to dissipate the heat of the servers. However, the ambient cooling air typically carries dust, which may adversely affect the safe operation of the servers.

What is needed, therefore, is a solution which can overcome the limitations described.

DETAILED DESCRIPTION

Figure 1:
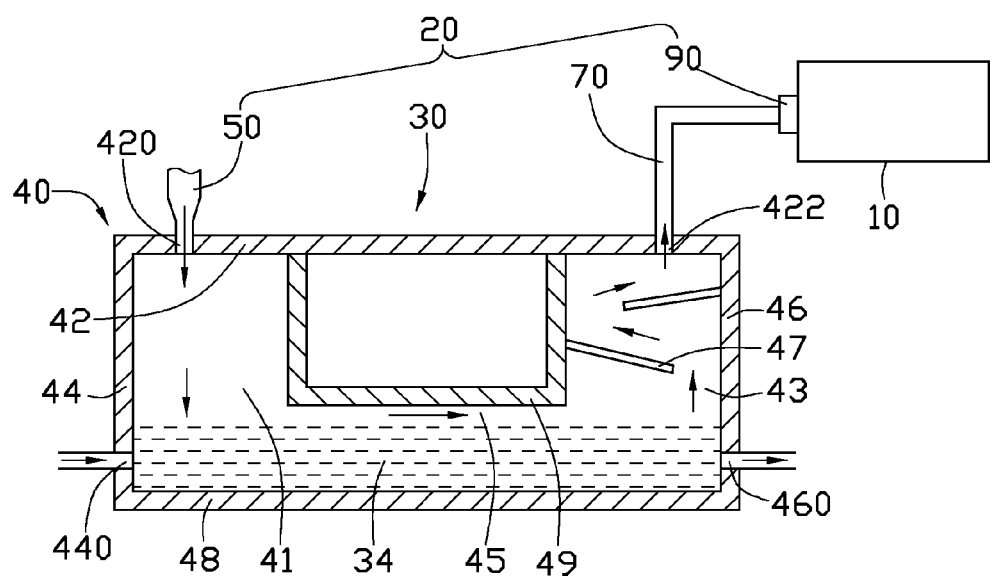
FIG. 1 is essentially a schematic, cross-sectional view of a container data center in accordance with a first embodiment of the disclosure.

Referring to FIG. 1, a container data center in accordance with an exemplary embodiment is shown. The container data center includes a container 10, a plurality of servers (not shown) mounted in the container 10, and a ventilating system 20 for dissipating heat of the servers.

The ventilating system 20 includes a filter 30, an inlet pipe 50, an exhaust pipe 70 and a fan (or blower) 90. The fan 90 is adapted for driving ambient cooling air through the filter 30 to the container 10, during which process the ambient cooling air is purified. In this embodiment, the fan 90 is fixed on the container 10. An inlet of the fan 90 is coupled to an outlet of the exhaust pipe 70, and an outlet of the fan 90 is coupled to the container 10. In alternative embodiments, the fan 90 can be arranged at an inlet of the inlet pipe 50. In such state, the inlet of the fan 90 faces the ambient while the outlet of the fan 90 is coupled to the inlet pipe 50.

The filter 30 includes a chamber 40 receiving filtering fluid 34 therein. The filtering fluid 34 is used to dissolve the dust in the ambient cooling air. In this embodiment, preferably, the filtering fluid 34 is pure water.

The chamber 40 defines an air inlet 420 and an air outlet 422 in a top side 42 thereof, for respectively connecting the inlet pipe 50 and the exhaust pipe 70. The air inlet 420 and the air outlet 422 are located adjacent to two opposite sides (left side 44 and right side 46 in FIG. 1) of the chamber 40, respectively.

A protrusion 49 extends down from a central portion of the top side 42 of the chamber 40 towards a bottom side 48 of the chamber 40. The protrusion 49 is higher than the bottom side 48 of the chamber 40. An inlet channel 41 is formed between the protrusion 49 and the left side 44 of the chamber 40, and an outlet channel 43 is formed between the protrusion 49 and the right side 46 of the chamber 40. The inlet channel 41 is aligned with the air inlet 420 of the chamber 40, and the outlet channel 43 is aligned with the air outlet 422 of the chamber 40.

A fluid inlet 440 is defined in a lateral side of the chamber 40 for injecting clean filtering fluid 34. In this embodiment, the fluid inlet 440 is formed in the left side 44 of the chamber 40, and is lower than the protrusion 49. Alternatively, the fluid inlet 440 can be higher than or at the same level as a bottom of the protrusion 49. A fluid outlet 460 is defined in one lateral side of the chamber 40 for exhausting polluted filtering fluid 34. In this embodiment, the fluid outlet 460 is formed in the right side 46 of the chamber 40, and is adjacent to the bottom side 48 of the chamber 40. In alternative embodiments, the fluid outlet 460 can be formed at the bottom side 48 of the chamber 40.

A plurality of baffles 47 is formed in the outlet channel 43 of the chamber 40, for further obstructing the dust in the ambient cooling air. The baffles 47 can be plastic or steel, and can be integrally formed with the chamber 40 as one monolithic piece. In this embodiment, the baffles 47 extend obliquely down from the right side 46 of the chamber 40 and from a side of the protrusion 49 facing the outlet channel 43, in an alternate manner. The baffles 47 overlap partly in a center of the outlet channel 43.

When the container date center is in use, the inlet pipe 50 is connected to the air inlet 420 of the chamber 40, and the exhaust pipe 70 is connected to the air outlet 422 of the chamber 40. The fan 90 is disposed with the inlet thereof coupled to the exhaust pipe 70 and the outlet thereof coupled to the container 10. The filtering fluid 34 is injected into the chamber 40 through the fluid inlet 440. An amount of the filtering fluid 34 injected into the chamber 40 should be controlled with a liquid level thereof lower than the protrusion 49. Thus a gap 45 is formed between the protrusion 49 and the filtering fluid 34 for flowing of the cooling air from the inlet channel 41 to the outlet channel 43.

During operation of the servers, heat is generated. The fan 90 operates to drive the ambient cooling air through the ventilating system 20 to the container 10 to cool the servers. After the cooling air enters the chamber 40 of the ventilating system 20 via the air inlet 420, the cooling air flows down along the inlet channel 41 towards the filtering fluid 34, during which process a portion of the dust in the cooling air falls into the filtering fluid 34. When the cooling air arrives at the liquid level of the filtering fluid 34, the cooling air turns to flow along the gap 45 to the outlet channel 43. During flowing of the cooling air along the gap 45, the cooling air touches the liquid level, and thus a majority of the dust in the cooling air falls into the filtering fluid 34.

When the cooling air flows up along the outlet channel 43 to exhaust from the filter 34, the cooling air flows tortuously in the outlet channel 43 under the guidance of the baffles 47, and thus almost all of remaining dust in the cooling air falls into the filtering fluid 34. Thus, the cooling air exhausting from the filter 30 is purified. In addition, the filtering fluid 34 is prevented from being sucked out from the filter 30 by the baffles 47 arranged in the outlet channel 43 of the filter 30. Accordingly, a humidity of the cooling air exhausting from the filter 30 is minimal. Accordingly, the safety of the servers which are cooled by the purified cooling air is enhanced. In testing, the filter 30 has demonstrated that it can remove more than 99.9% of dust with a particle size not less than 0.3 µm.

In the above-described embodiment, only one filter 30 is utilized. It should be understood that plural filters can be connected in series to purify the ambient cooling air. In addition, after the ventilating system 20 has worked for a period of time, the filtering fluid 34 of the filter 30 becomes polluted to a threshold level by the dust of the ambient cooling air, and can be exhausted through the fluid outlet 460. Thereupon clean filtering fluid 34 is injected to continue purifying the ambient cooling air.

Figure 2:
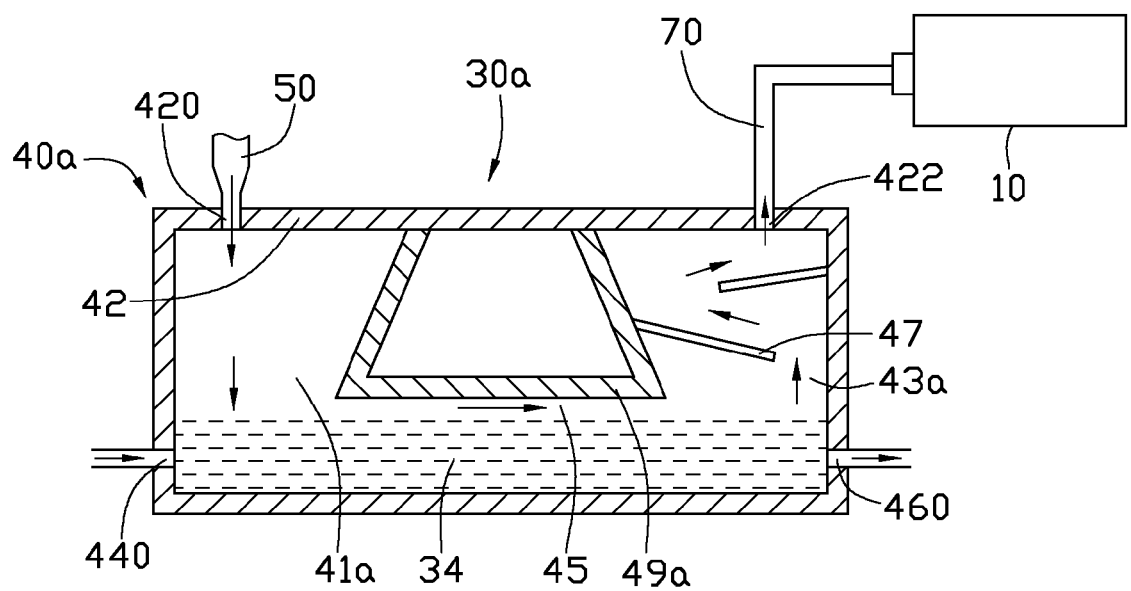
FIG. 2 is essentially a schematic, cross-sectional view of a container data center in accordance with a second embodiment of the disclosure.

FIG. 2 shows a container data center in accordance with a second embodiment. The difference between the second embodiment and the first embodiment is a shape of a protrusion 49a of a chamber 40a of a filter 30a of the container data center of the second embodiment. In this embodiment, the protrusion 49a expands downwards, i.e., expands along a direction away from a top side 42 of the container 10. Thus, an inlet channel 41a of the filter 30a converges downwards, and an outlet channel 43a of the filter 30a diverges upwards. When the cooling air flows down along the inlet channel 41a, a speed of the cooling air gradually increases due to the converged inlet channel 41a, and thus more of the dust can fall into the filtering fluid 34. When the cooling air flows up along the outlet channel 43a, the speed of the cooling air gradually decreases due to the diverged outlet channel 43a, and this helps avoid dust and the filtering fluid 34 escaping from the filter 30a.

Figure 3:
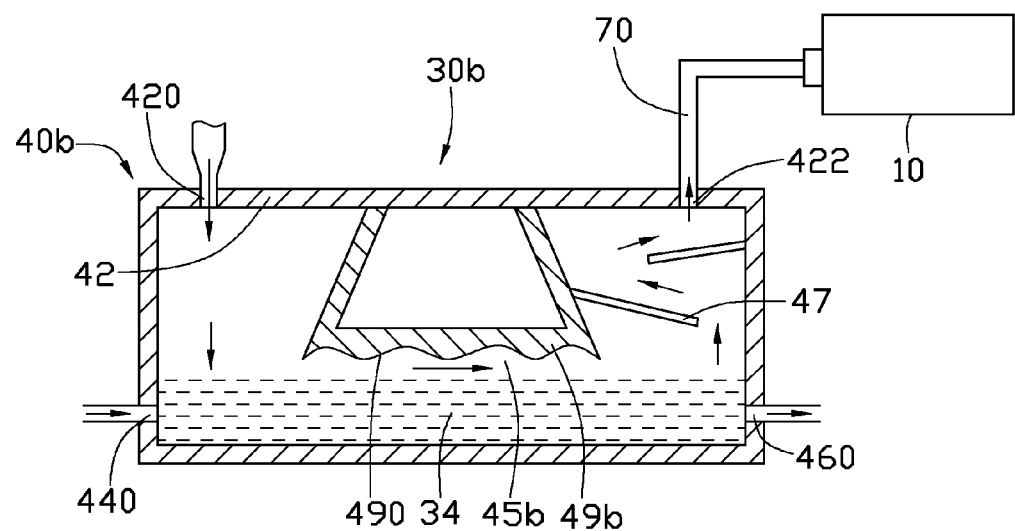
FIG. 3 is essentially a schematic, cross-sectional view of a container data center in accordance with a third embodiment of the disclosure.

Referring to FIG. 3, a container data center according to a third embodiment is shown. Unlike in the second embodiment, an end surface 490 of a protrusion 49b of a chamber 40b of a filter 30b of the container data center of the third embodiment is uneven. When the cooling air flows along a gap 45b between the protrusion 49b and the filtering fluid 34, due to the uneven end surface 490 of the protrusion 49b, irregular and violent movements of particles of the cooling air are more pronounced, and there are more irregular and violent movements of the particles of the cooling air. Accordingly, more dust can fall into the filtering fluid 34, which can further purify the cooling air.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A container data center, comprising:
   a container;
   a plurality of servers received in the container; and
   a ventilating system comprising:
      a filter comprising a chamber and filtering fluid received in the chamber, the chamber defining an air inlet for entry of ambient air and an air outlet, the filtering fluid for trapping dust in the ambient air;
      an exhaust pipe having one end coupled to the air outlet of the filter and another end communicating an interior of the container; and
      a fan for driving the ambient air out of the filter to flow along the exhaust pipe to the container to cool the servers.

2. The container data center of claim 1, wherein the filtering fluid is pure water.

3. The container data center of claim 1, wherein the air inlet and the air outlet are formed on a top side of the chamber.

4. The container data center of claim 3, wherein the air inlet and the air outlet are respectively located adjacent to opposite lateral sides of the container, a protrusion extends down from a central portion of the top side of the container towards a bottom side of the chamber, an inlet channel and an outlet channel are respectively defined at opposite sides of the protrusion, the inlet channel is aligned with the air inlet, and the outlet channel is aligned with the air outlet.

5. The container data center of claim 4, wherein a liquid level of the filtering fluid is lower than the protrusion, and a gap is defined between the filtering fluid and the protrusion intercommunicating the inlet channel and the outlet channel.

6. The container data center of claim 5, wherein an end surface of the protrusion facing the gap is uneven.

7. The container data center of claim 4, wherein the protrusion expands from the top side towards the bottom side of the chamber, the inlet channel converges downwards, and the outlet channel diverges upwards.

8. The container data center of claim 4, wherein a plurality of baffles is formed in the outlet channel, and overlaps partly in a central portion of the outlet channel.

9. The container data center of claim 1, wherein the fan is fixed on the container with an inlet thereof coupled to the exhaust pipe and an outlet thereof coupled to the container.

10. The container data center of claim 1, wherein the chamber defines a fluid inlet for injecting the filtering fluid and a fluid outlet for exhausting polluted filtering fluid.

11. A ventilating system for cooling a container data center, the ventilating system comprising:
    a filter comprising a chamber and filtering fluid received in the chamber, the chamber defining an air inlet for entry of ambient air and an air outlet, the filtering fluid for trapping dust in the ambient air;
    an exhaust pipe having one end coupled to the air outlet of the filter and another end adapted for exhausting the ambient air to the container data center; and
    a fan for driving the ambient air out of the filter to flow along the exhaust pipe toward the another end of the exhaust pipe.

12. The ventilating system of claim 11, wherein the filtering fluid is pure water.

13. The ventilating system of claim 11, wherein the air inlet and the air outlet are formed on a top side of the chamber.

14. The ventilating system of claim 13, wherein the air inlet and the air outlet are respectively located adjacent to opposite lateral sides of the container, a protrusion extends down from a central portion of the top side towards a bottom side of the chamber, an inlet channel and an outlet channel are respectively defined at opposite sides of the protrusion, the inlet channel is aligned with the air inlet, and the outlet channel is aligned with the air outlet.

15. The ventilating system of claim 14, wherein a liquid level of the filtering fluid is lower than the protrusion, and a gap is defined between the filtering fluid and the protrusion intercommunicating the inlet channel and the outlet channel.

16. The ventilating system of claim 15, wherein an end surface of the protrusion facing the gap is uneven.

17. The ventilating system of claim 14, wherein the protrusion expands from the top side towards the bottom side, the inlet channel converges downwards, and the outlet channel diverges upwards.

18. The ventilating system of claim 14, wherein a plurality of baffles is formed in the outlet channel, and overlaps partly in a central portion of the outlet channel.

19. The ventilating system of claim 11, wherein the fan is disposed in such a manner than an inlet thereof coupled to the exhaust pipe.

20. The ventilating system of claim 11, wherein the chamber defines a fluid inlet for injecting the filtering fluid and a fluid outlet for exhausting polluted filtering fluid.

* * * * *